United States Patent [19]

Myoji

[11] Patent Number: 4,582,970

[45] Date of Patent: Apr. 15, 1986

[54] SWITCHING CIRCUIT ADAPTABLE TO COOKING APPLIANCE

[75] Inventor: Toshiro Myoji, Yao, Japan

[73] Assignee: Sharp Kabushiki Kaisha, Osaka, Japan

[21] Appl. No.: 656,002

[22] Filed: Oct. 1, 1984

Related U.S. Application Data

[63] Continuation of Ser. No. 469,721, Feb. 25, 1983, abandoned.

[30] Foreign Application Priority Data

Feb. 27, 1982 [JP] Japan .............................. 57-27739[U]

[51] Int. Cl.⁴ .............................................. H05B 6/64
[52] U.S. Cl. ................................................. 219/10.55 B
[58] Field of Search ............... 219/492, 501, 502, 508, 219/10.55 B, 10.55 C; 340/365 R, 365 C, 712; 200/DIG. 1

[56] References Cited

U.S. PATENT DOCUMENTS

| | | | |
|---|---|---|---|
| 3,111,608 | 11/1963 | Boenning et al. | 200/DIG. 1 |
| 3,200,306 | 8/1965 | Atkins et al. | 200/DIG. 1 |
| 3,886,539 | 5/1975 | Gould, Jr. | 340/365 C |
| 4,309,584 | 1/1982 | Terakami | 219/492 |

Primary Examiner—C. L. Albritton
Assistant Examiner—M. M. Lateef
Attorney, Agent, or Firm—Birch, Stewart, Kolasch & Birch

[57] ABSTRACT

A switching circuit comprises a first transistor, a second transistor operated to be turn on and off by changing a voltage applied to its gate, and a switching element connected between the first transistor and the second transistor. The switching element is grounded via a first resistor and is connected via a second resistor to a power source for supplying a voltage which is obtained by adding a voltage higher than an estimated noise voltage and a threshold voltage of the second transistor.

6 Claims, 6 Drawing Figures

SWITCHING CIRCUIT ADAPTABLE TO COOKING APPLIANCE

This application is a continuation of application Ser. No. 469,721 filed on Feb. 25, 1983, now abandoned.

BACKGROUND OF THE INVENTION

The present invention relates to a switching circuit and, more particularly, to a matrix switching circuit adaptable to a cooking appliance.

FIG. 1 shows a conventional switching circuit comprising a first transistor Q1, a second transistor Q2, a first resistor R1, a switch SW, a second resistor R2, and a third resistor R3.

The first resistor R1, the switch SW, and the second resistor R2 are connected between the drain of the first transistor Q1 and the gate of the second transistor Q2. Between the switch SW and the second resistor R2, the third resistor R3 grounded is connected.

A voltage of about 10 V is applied to the sources of the first transistor Q1 and the second transistor Q2. When a voltage of VG is applied to the gates of the transistors Q1 and Q2, these transistors function as follows:

7.45 V $\leq$ VG $\leq$ 10 V: conductive
0 V $\leq$ VG $\leq$ 5.8 V: non-conductive
5.8 V < VG < 7.45 V: unstable The values of the resistors are as follows:
The first resistor R1 $\approx$ 10 K ohm
The second resistor R2 $\approx$ 10 K ohm
The third resistor R3 $\approx$ 50 K ohm
The contact resistance of the switch SW $\approx$ 5 K ohm When the switch SW is conductive, a connection point A between the first resistor R1 and the switch SW bears a voltage of about 8.5 V, and another connection point B between the switch SW and the second resistor R2 bears a voltage of about 7.7 V.

As the first transistor Q1 is conductive, a voltage higher than the threshold voltage of about 7.45 V(VT) of the second transistor Q2 by about 0.25 V is applied to the gate of the second transistor Q2. Then, the second transistor Q2 is conductive so that the drain of this transistor bears a voltage of about 10 V. The drain bears the zero voltage when the switch SW is non-conductive. Thus, the switch SW is operated.

Unfortunately, a voltage for making the second transistor Q2 conductive in response to the actuation of the switch SW is only higher than the threshold voltage VT of the second transistor Q2 by about 0.25 V.

Little allowance for the presence of a noise voltage is therfore provided. When a negative noise voltage of about 0.3 V is applied to the connection point B, the second transistor Q2 fails to become conductive in response to the actuation of the switch SW. Thus, a stable operation cannot be expected in the switching circuit of FIG. 1.

SUMMARY OF THE INVENTION

Accordingly, it is an object of the present invention to provide an improved switching circuit for enabling a stable operation even when a noise voltage is applied the the switching circuit.

It is another object of the present invention to provide an improved matrix switching circuit for enabling stable operation even when a noise voltage is applied to the switching circuit.

Briefly described, in accordance with the present invention, a switching circuit comprises first transistor means, second transistor means operated to be turn on and off by changing a voltage applied to its gate means, and switching means connected between the first transistor means and the second transistor means. The switching means is grounded via first resistor means and is connected via second resistor means to power source means for supplying a voltage which is obtained by adding a voltage higher than an estimated noise voltage and a threshold voltage of the second transistor means.

A plurality of switching circuits are arranged in a matrix to be suitable for a switching assembly for controlling a cooking appratus, e.g., a microwave oven.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE INVENTION

Figure 2:
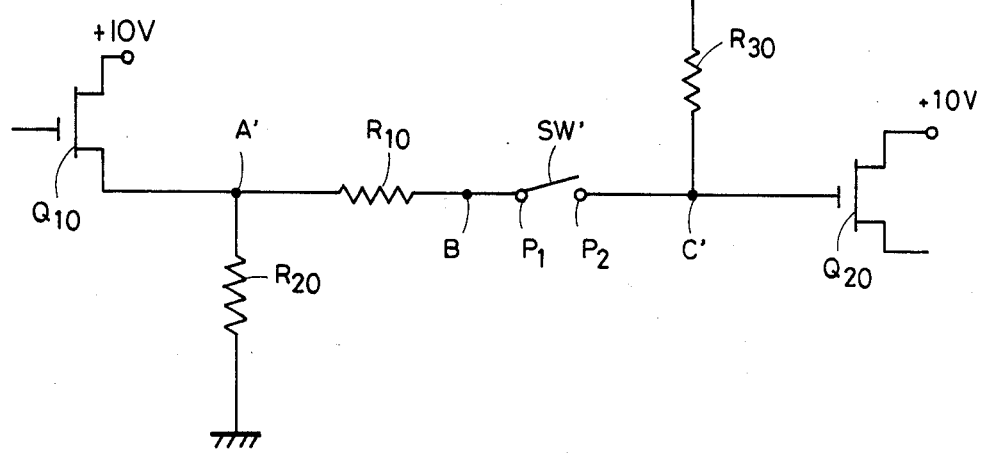
FIG. 2 shows a configuration of a switching circuit according to the present invention.

FIG. 2 shows a configuration of a switching circuit according to the present invention. The switching circuit comprises a first transistor Q10, a second transistor Q20, a first resistor R10, a switch SW', a second resistor R20, and a third resistor R30.

A DC voltage of about 10 V is applied to the sources of the first transistor Q10 and the second transistor Q20. The first resistor R10 and the switch SW' are serially connected between the drain of the first transistor Q10 and the gate of the second transistor Q20. The switch SW' includes a first terminal P1 and a second terminal P2. The second resistor R20 is connected between the ground and a connection point A' of the first transistor Q10 and the first resistor R10.

The first terminal P1 of the switch SW' is connected to the first resistor R10 at another connection point B. The third resistor R30 is connected between the second terminal P2 and a power source of about 10 V. The resistance of each of the resistors is as follows:

The first resistor R10 $\approx$ 10 K ohm
The second resistor R20 $\approx$ 10 K ohm
The third resistor R30 $\approx$ 100 K ohm
The contact resistance of the switch SW' $\approx$ 50 K ohm Normally, the first transistor Q10 is conductive. It is non-conductive when the second transistor Q20 is turned off in response to the closing of the switch SW'. A control circuit for enabling the first transistor Q10 to be switched on and off at this timing may be provided although not specifically shown.

While the switch SW' is non-conductive, a voltage of about 10 V is applied to the gate of the second transistor Q20 via the third resistor R30 positioned at a high voltage side. Hence, the second transistor Q20 is conductive. Therefore, the drain of the second transistor Q20 bears a voltage of about 10 V.

When the switch SW' is made conductive by closing the first terminal P1 and the second terminal P2, a connection point C' between the second terminal P2 and the third resistor R30 bears a voltage of about 10 V when the first transistor Q10 is conductive. Therefore, the second transistor Q20 remains conductive.

When the switch SW' is conductive and the first transistor Q10 is non-conductive, the connection point A bears the zero voltage, so that the connection point C bears a voltage of about 3.6 V. Hence, a voltage of about 3.6 V is applied to the gate of the second transistor Q20, so that the second transistor Q20 is non-conductive. At this time, the drain of the second transistor Q20 bears the zero voltage, so that it can be recognized and read out that the switch SW' is conductive.

Figure 1:
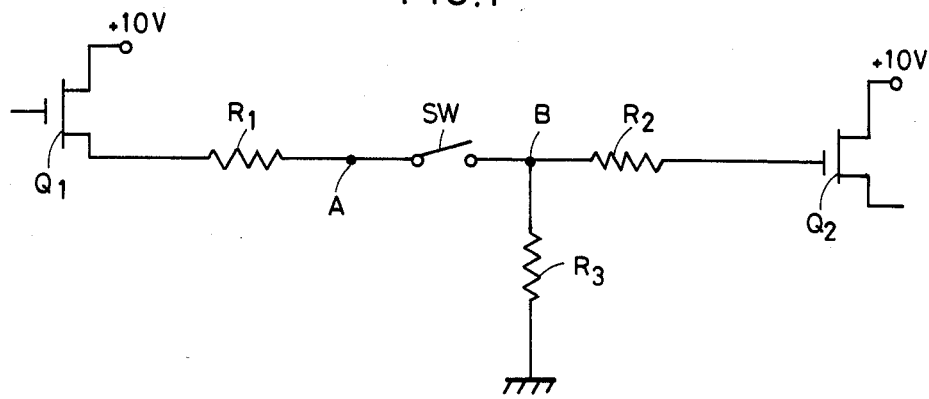
FIG. 1 shows a configuration of a conventional switching circuit.

In the circuit of FIG. 1, when the switch SW is conductive, a voltage of about 7.7 V is applied to the gate of the second transistor Q20, so that the drain of the second transistor Q20 is permitted to bear a voltage of about 10 V. In this manner, the switch SW is operated in a positive logic.

On the contrary, the switch SW' of the circuit of FIG. 2 is operated in a negative logic.

Comparing the operations of FIGS. 1 and 2, while the switches SW and SW' are nonconductive, the second transistor Q2 in the circuit of FIG. 1 is non-conductive and the second transistor Q20 in the circuit of FIG. 2 is conductive. It may be possible in the circuits of FIGS. 1 and 2 that the states of the second transistors Q2 and Q20 are stably maintained.

However, when the switch SW becomes conductive, the second transistor Q2 in FIG. 1 must be turned on in a range of about 2.55 V between 7.45 V and 10 V. Therefore, it is difficult to select the resistances of the first to the third resistors R1, R2 and R3, to make the contact resistance of the switch SW great, and to be stable against a noise voltage.

On the contrary, according to the circuit of FIG. 2 of the present invention, when the switch SW' becomes conductive, the second transistor Q20 should be turned on in a range of about 5.8 V between 0 V and 5.8 V. Therefore, it becomes easy to select the resistance of the first to the third resistors R10, R20 and R30, to make the contact resistance of the switch SW' great, and to be stable against a noise voltage. Thus, the circuit of FIG. 2 is improved.

Thus, according to the present invention, the first terminal P1 of the switch SW' is grounded via the second resistor R20. The second terminal P2 of the switch SW' is coupled to the power source via the third resistor R30. The power source is provided for supplying a voltage, higher than an estimated noise voltage, plus a voltage identical to the threshold voltage of the second transistor Q20.

When the switch SW' is non-conductive by separating one of the terminals P1 and P2, the second transistor Q20 becomes conductive by applying the voltage from the power source into the gate of the second transistor Q20. When the switch SW' is conductive, the second transistor Q20 becomes non-conductive by supplying a voltage the gate of the second transistor Q20. This voltage is obtained by dividing the voltage from the power source by all the resistances of the second resistor R20, the third resistor R30, and the contact resistance of the switch SW'.

A voltage to be applied to the gate of the second transistor Q20 for making the second transistor Q20 operative in response to the actuation of the switch SW' should be in the following range:

$$0\ V \leqq VG \leqq 5.8\ V$$

As compared with the conventional range of about 2.55 V(=10−7.45) in FIG. 1, a wide range of about 3.25 V(=5.8−2.55) can be obtained. Thus, wide allowance against the noise voltage can be provided, also. Since it is possible that the contact resistance of the switch SW' is great, a carbon paper ets. can be adopted for providing the switch SW', which is very economic.

Figure 3:
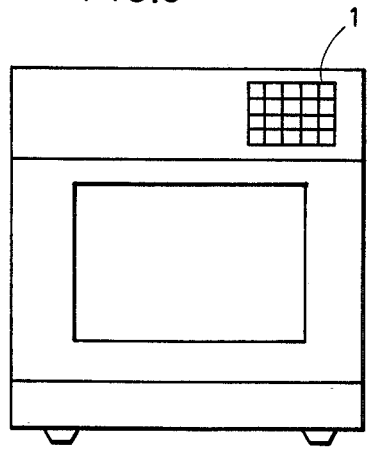
FIG. 3 shows a front view of a microwave oven to which a matrix switching assembly of the present invention is adapted.

The circuit of FIG. 2 can be adopted for a cooking apparatus, e.g., a microwave oven. FIG. 3 shows a microwave oven equipped with a matrix switching assembly 1 in which a plurality of switching circuits of FIG. 2 are connected in a matrix.

Figure 4:
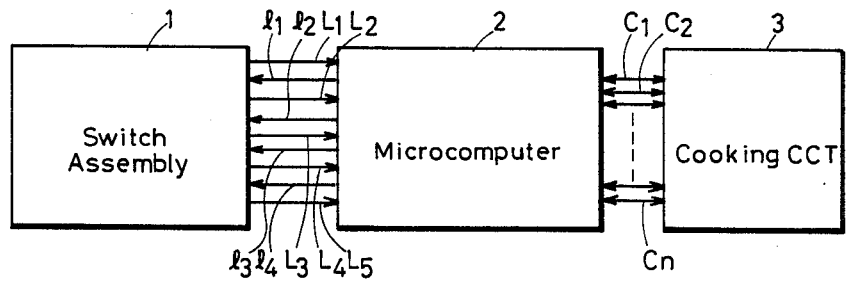
FIG. 4 shows a block diagram of a circuit in the microwave oven of FIG. 3.

FIG. 4 shows a circuit implemented within the microwave oven of FIG. 3. The circuit comprises the matrix switching assembly 1, a microcomputer 2, and a cooking circuit 3.

The matrix switching assembly 1 is connected to the microcomputer 2 via four column signal lines 11 to 14 and five row signal lines L1 to L5. The cooking circuit 3 is communicated with the microcomputer 2 via cooking signal lines C1 to Cn to transmit and receive cooking information to cook a foodstuff according to a conventional cooking control.

Figure 5:
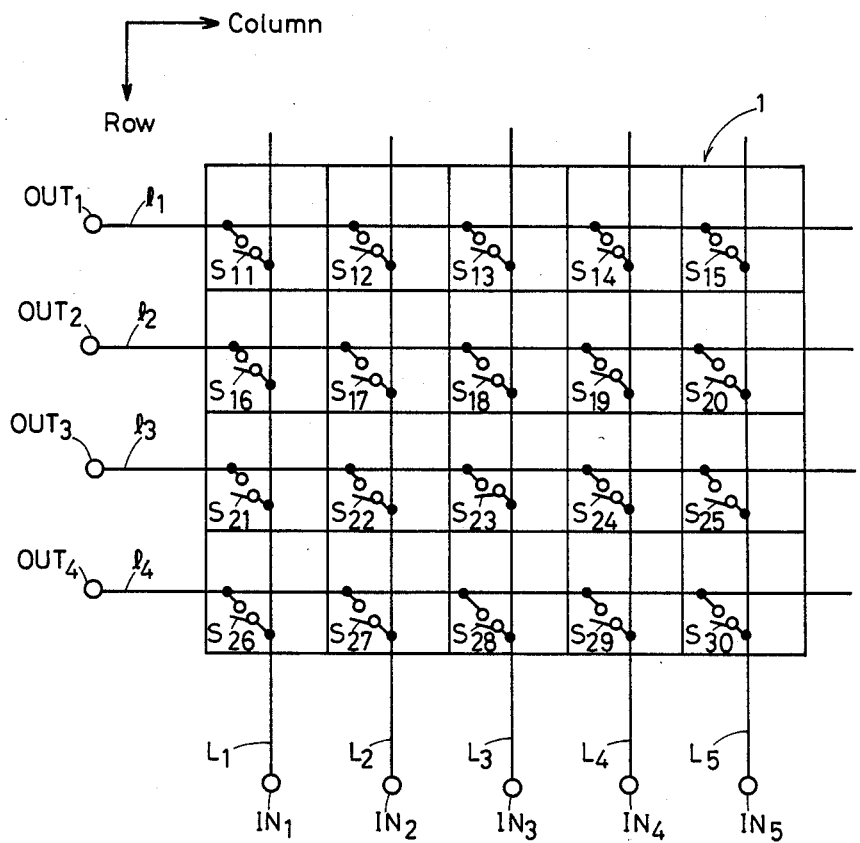
FIG. 5 shows a configuration of the matrix switch assembly.

FIG. 5 shows a configuration of the matrix switching assembly 1 comprising a plurality of switches in columns and rows. In the first column, first to fifth switches S11 to S15 are connected. In the second column, sixth to tenth switches S16 to S20 are connected. In the third column, eleventh to fifteenth switches S21 to S25 are connected. And, finally, in the fourth column, sixteenth to twentieth switches S26 to S30 are connected.

To the first column signal line 11, the first to the fifth switches S11 to S15 are connected, respectively. To the first to the fifth row signal lines L1 to L5, the first to the fifth switches S11 to S15 are connected, respectively. To the second column signal line 12, the sixth to the tenth switches S16 to S20 are connected, respectively. To the first to the fifth row signal lines L1 to L5, the sixth to the tenth switches S16 to S20 are connected, respectively. To the third column signal line 13, the eleventh to the fifteenth switches S21 to S25 are connected, respectively.

To the first to the fifth row signal lines L1 to L5, the eleventh to the fifteenth switches S21 to S25 are connected, respectively. To the fourth column signal line 14, the sixteenth to the twentieth switches S26 to S30 are connected, respectively. To the first to the fifth row signal lines L1 to L5, the sixteenth to the twentieth switches S26 to S30 are connected, respectively.

Figure 6:
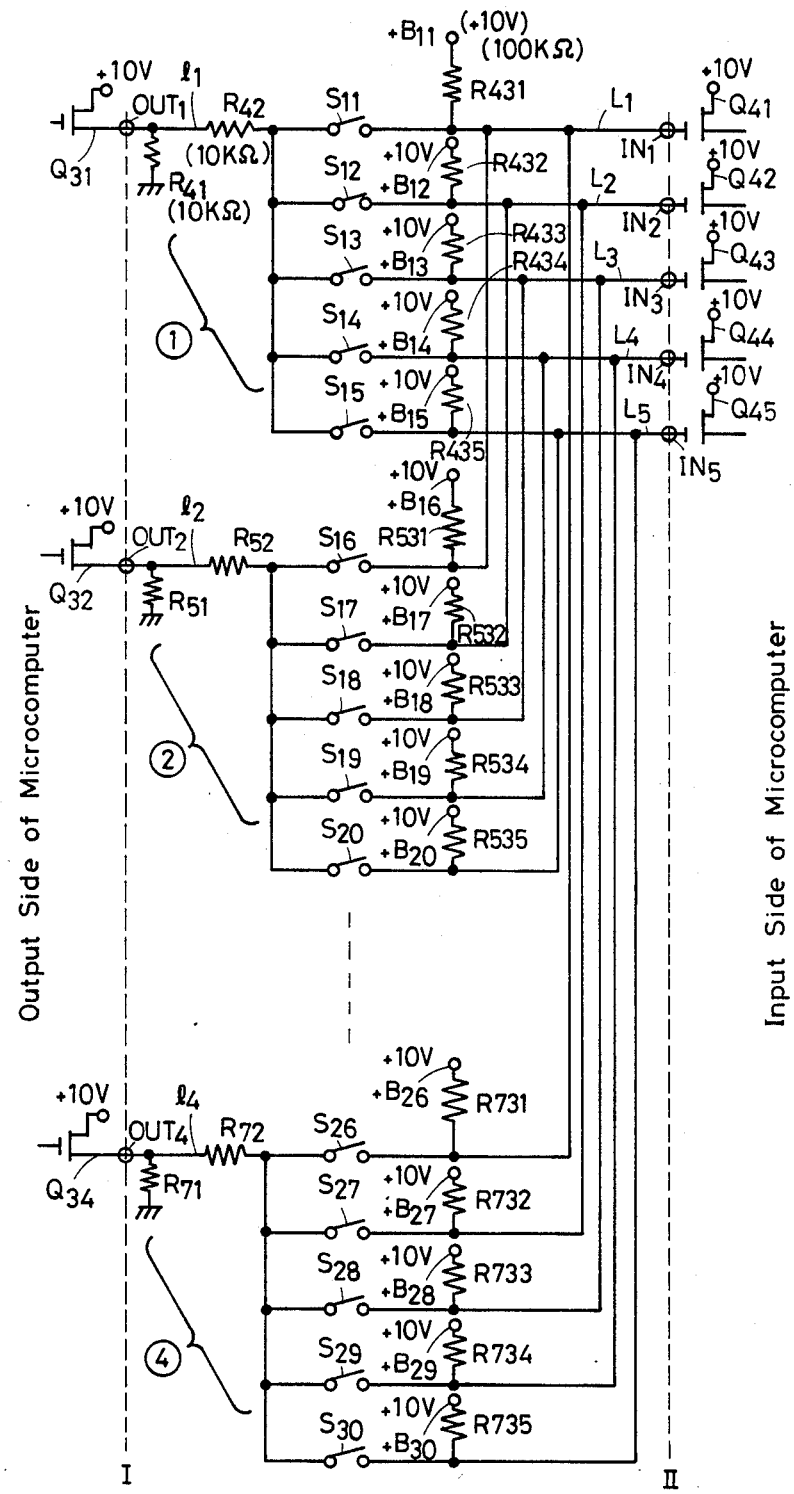
FIG. 6 shows a more detailed configuration of the matrix switch assembly.

FIG. 6 shows a more detailed configuration of the matrix switch assembly 1 comprising the first to the twentieth switches S11 to S30 arranged as described in FIG. 5. For convenience, the eleventh to the fifteenth switches S21 to S25 are omitted from drawing.

The output side of the microcomputer 2 is positioned at the left of dotted line I of FIG. 6. The input side of the microcomputer 2 is positioned at the right of dotted line II of FIG. 6.

At the output side of the microcomputer 2, the drains of first to fourth column switching transistors Q31 to Q34 are connected to first to fourth output terminals OUT1 to OUT4 of this microcomputer 2. At the input side of the microcomputer 2, the gates of first to fifth row switching transistors Q41 to Q45 are connected to first to fifth input terminals IN1 to IN5 of this microcomputer 2.

The first to the fourth output terminals OUT1 to OUT4 are connected, respectively, to the first to the fourth column signla lines 11 to 14. The first to the fifth input terminals IN1 to IN5 are connected, respectively, to the first to the fifth row signal lines L1 to L5.

In the first column signal line 11, a resistor R42 of about 10 K ohm is connected between the first output terminal OUT1 and the first to the fifth switches S11 to S15. A resistor R41 of about 10 K ohm is connected between the ground and both of the resistor R42 and the first output terminal OUT1. DC power sources B11 to B15 of about 10 V are coupled to the first to the fifth switches S11 to S15 via resistors R431 to R435 of about 100 K ohm.

Thus, a first circuit ①  is formed in the first column signal line 11 between the first output terminal OUT1 and the first to the fifth input terminals IN1 to IN5. Second to fourth circuits ② to ④ are formed in the second to the fourth column signal lines 12 to 14 between the second to the fourth output terminals OUT2 to OUT4, and the first to the fifth input terminals IN1 to IN5.

In operation, the microcomputer 2 generates time sharing signals into the gates of the first to the fourth column switching transistors Q31 to Q34, subsequently. Then, these transistors are turned on and off at the different timings.

Now, it is assumed that the first switch S11 is a cooking switch actuated to instruct the initiation of cooking. While the first switch S11 is non-conductive, the first row switching transistor Q41 is not non-conductive even when the first column switching transistor Q31 becomes non-conductive.

Here, when the sixth switch S16, the eleventh switch S21 or the sixteenth switch S26 becomes conductive, the first row switching transistor Q41 becomes nonconductive at the time when the second to the fourth column switching transistors Q32 to Q34 become non-conductive. But, the microcomputer 2 does not generate a cooking start instruction signal into the cooking circuit 3, so that the microwave oven does not start cooking, except when the first column switching transistor Q31 becomes non-conductive and, in addition, the first switch S11 becomes conductive.

When the first switch S11 becomes conductive, the first row switching transistor Q41 becomes non-conductive at the timing when the first column switching transistor Q31 becomes non-conductive. Therefore, the microcomputer 2 generates the cooking start instruction into the circuit 3 to thereby start cooking.

The second to the tenth switches S12 to S20 (also, the eleventh to the fifteenth switches S21 to S25) can be selected to be specific cooking instruction keys actuated to instruct to enable specific sooking. For example, the second switch S12 is actuated to stop cooking. The third switch S13 is actuated to start a timer for counting a cooking time. When the microwave oven of FIG. 3 functions as a grill oven, the fourth switch S14 is actuated to start grilling, and the fifth switch S15 is actuated to start an oven cooking, for example.

Since the matrix switching assembly 1 includes a pluarlity of switches which may be very adjacent each other, there arises the fear that adjacent switches are simultaneously actuated. However, according to the present invention, the simultaneous actuation of the switches is not read by the microcomputer 2 as follows:

It is now assumed that both the first switch S11 and the sixth switch S16 adjacent the first switch S11 in row are actuated simultaneously, that the first column switching transistor Q31 is conductive, and that the second column switching transistor Q32 is non-conductive.

Therefore, the first input terminal IN1 does not bear a voltage for making the first row switching transistor Q41 non-conductive because of the appearance of a voltage of about 10 V at the drain of the first column switching transistor Q31. Therefore, the first row switching transistor Q41 remains conductive, meaning that both the first switch S11 and the sixth switch S16 are non-conductive.

Accordingly, the microcomputer 2 cannot read that any switches are actuated, so that the microcomputer 2 does not generate any cooking signal into the cooking circuit 3. Thus, the simultaneous actuation of the switches does not evole any inconvenience.

While only certain embodiments of the present invention have been described, it will be apparent to those skilled in the art that various changes and modifications may be made therein without departing from the sprit and scope of the present invention as claimed.

What is claimed is:

1. A switching circuit comprising:
    a ground terminal;
    first transistor means for switching a drain terminal thereof to a source voltage connected to a source terminal thereof;
    second transistor means responsive to the voltage applied to a gate input thereof for selectively interconnecting a drain and a source terminal thereof;
    a switch serially connected to said gate of said second transistor means at a first junction point;
    a first resistance connected between a source of voltage and said first junction point;
    a second resistance interconnecting said drain of said first transistor at a second junction point and said switch at a third junction point;
    a third resistance connected between said second junction point and said ground terminal.

2. A switching matrix comprising:
    a plurality of switching circuits having switches arranged in rows and columns comprising:
    a ground terminal;
    first transistor means for switching a drain terminal to a source voltage connected to a source terminal thereof;
    second transistor means responsive to the voltage applied to a gate imput thereof for selectively interconnecting a drain and a source terminal thereof;
    a switch serially connected to said gate of said second transistor means at a first junction point;
    a first resistance connected between a source of voltage and said first junction point;
    a second resistance interconnecting said drain of said first transistor means at a second junction point and said switch at a third junction point;
    a third resistance connected between said second junction point and said ground terminal;
    each of said switching circuits arranged in a row having common first transistor means;

each of said switching circuits arranged in a column having common second transistor means.

3. The switching matrix of claim 2 wherein said first transistor means of each row are sequentially strobed.

4. The switching matrix of claim 3 wherein said matrix is used in a cooking apparatus.

5. The switching matrix of claim 4 wherein said matrix is used in a microwave oven.

6. A switching circuit comprising:
a ground terminal;
a source voltage supply;
a first transistor having a source connected to said source voltage supply and having a drain;
a first resistance connected between said drain of said first transistor and said ground terminal;
a switch having first and second terminals;
a second resistance connected between said drain of said first transistor and said first switch terminal;
a second transistor having a gate, drain and source, said source of said second transistor being connected to said source voltage supply, said gate being connected to said second switch terminal; and
a third resistance connected between said gate of said second transistor and said source voltage supply;
said second transistor being conductive when said switch is open circuited;
said second transistor being non-conductive when said switch is close circuited and said first transistor is non-conductive.

* * * * *